US012625167B2

(12) United States Patent
Hozoi et al.

(10) Patent No.: US 12,625,167 B2
(45) Date of Patent: May 12, 2026

(54) CURRENT SENSING DEVICE

(71) Applicant: ABB Schweiz AG, Baden (CH)

(72) Inventors: Adrian Hozoi, Mannheim (DE);
Jaromir Podzemny, Brno (CZ)

(73) Assignee: ABB Schweiz AG, Baden (CH)

( * ) Notice: Subject to any disclaimer, the term of this
patent is extended or adjusted under 35
U.S.C. 154(b) by 108 days.

(21) Appl. No.: 18/621,287

(22) Filed: Mar. 29, 2024

(65) Prior Publication Data

US 2024/0329091 A1 Oct. 3, 2024

(30) Foreign Application Priority Data

Mar. 30, 2023 (EP) ..................................... 23165433

(51) Int. Cl.
*G01R 15/18* (2006.01)
*G01R 19/00* (2006.01)
(52) U.S. Cl.
CPC ....... *G01R 15/181* (2013.01); *G01R 19/0092*
(2013.01)
(58) Field of Classification Search
CPC .. G01R 15/18; G01R 15/181; G01R 19/0092;
H01F 2027/065; H05K 1/145; H05K
1/182; H05K 2201/1003; H05K
2203/167; H05K 3/306
See application file for complete search history.

(56) References Cited

U.S. PATENT DOCUMENTS

| | | | |
|---|---|---|---|
| 4,709,205 A | 11/1987 | Baurand et al. | |
| 4,904,975 A * | 2/1990 | Medenbach | H01F 5/02 |
| | | | 336/185 |

| | | | |
|---|---|---|---|
| 6,507,261 B1 | 1/2003 | Haga et al. | |
| 9,151,782 B2 | 10/2015 | Lint et al. | |
| 9,664,711 B2 | 5/2017 | Lint et al. | |
| 2022/0262557 A1 | 8/2022 | Imazato et al. | |
| 2023/0136151 A1 * | 5/2023 | Cima ................... | G01R 15/181 |
| | | | 324/126 |

FOREIGN PATENT DOCUMENTS

| | | |
|---|---|---|
| DE | 1952879 U | 1/1967 |
| EP | 0209415 B1 | 11/1989 |
| WO | WO 85/01387 A1 | 3/1985 |

OTHER PUBLICATIONS

European Patent Office, Extended European Search Report in
European Patent Application No. 23165433.6, 10 pp. (Sep. 19,
2023).

* cited by examiner

*Primary Examiner* — Judy Nguyen
*Assistant Examiner* — Adam S Clarke
(74) *Attorney, Agent, or Firm* — Fitch Even Tabin &
Flannery LLP

(57) ABSTRACT

A current sensing device includes a substrate and one or
more coil elements. The substrate comprises a plurality of
holes extending at least partially through the substrate from
a first surface of the substrate. The coil element comprises
two locating pins. A first locating pin engages a locating
cavity of a first flange and locates in a first hole. A second
locating pin engages another locating cavity of a second
flange and locates in a second hole. The end of the first
locating pin bends to form an obtuse angle. The end of the
second locating pin also bends to form an obtuse angle.

13 Claims, 8 Drawing Sheets

CURRENT SENSING DEVICE

CROSS-REFERENCE TO RELATED APPLICATIONS

The instant application claims priority to European Patent Application No. 23165433.6, filed Mar. 30, 2023, which is incorporated herein in its entirety by reference.

FIELD OF THE DISCLOSURE

The present disclosure generally relates to a current sensing device and a method of manufacturing a current sensing device.

BACKGROUND OF THE INVENTION

Current sensing devices comprising one or more coil elements have been receiving increasing interest in the last decades. A coil element comprises a bobbin and a winding segment applied on a winding body of the bobbin which is non-magnetic and non-conductive, where the winding segment is formed from a length of wire wound around a central axis of the winding body. A current sensing device can have just one coil element, however a current sensing device can have a plurality of coil elements. In such a current sensing device with a plurality of coil elements, a common form is the Rogowski coil configuration, where the coil elements are arranged to form an approximately closed path around an opening foreseen for a conductor and are connected electrically to sum their signals and to provide a measurement voltage of the device, which is indicative of the current in the conductor.

U.S. Pat. No. 9,664,711B2 describes placing the bobbin elements into cavities or slots of a plastic carrier and using alignment posts to facilitate individual placement of the bobbin elements within an encapsulating header. However, this does not provide for precise and economical positioning of the bobbin elements on substrates, and also has no consideration to do so on simple substrates like PCBs.

It is also known to mount coil elements on a PCB using basic component placement concepts, not optimized for high positioning precision. EP0209415B1 describes mounting a plurality of coil elements on a PCB, where fixing of a coil element is implicitly achieved through its electrical connecting pins. Significant clearance is needed between a connecting pin and a mating PCB hole to reduce the risk to stress the pin during mating and to ensure that the electrical connection or the winding wire connected to the pin is not severed or cut. However, this placement of coil elements on a PCB using a basic component placement concept results in limited positioning precision.

In bulkier applications like transformers or relays, a coil can be firmly fixed to a substrate using fasteners like screws, however, the solutions are not sufficiently precise and compact for the device here.

BRIEF SUMMARY OF THE INVENTION

The present disclosure describes an improved current sensing device. In a first aspect, there is provided a current sensing device, comprising a substrate; and one or more coil elements. The substrate comprises a plurality of holes projecting at least part way through the substrate from a first surface of the substrate. Prior to a coil element being mounted to the substrate each of the plurality holes has a circular cross section. The coil element comprises a winding body; two flanges located at either end of the winding body; a length of wire; and two locating pins. The winding body has an outer surface around an axis of the winding body, and at least a portion of the length of wire is wound multiple times around the outer surface of the winding body in a generally circumferential direction with respect to the axis of the winding body.

When the coil element is mounted to the first surface of the substrate, a first locating pin of the two locating pins is engaged in at least one locating cavity of a first flange of the two flanges and an end portion of the first locating pin of the two locating pins is located in a first hole of the plurality of holes, and a second locating pin of the two locating pins is engaged in at least one locating cavity of a second flange of the two flanges and an end portion of the second locating pin is located in a second hole of the plurality of holes. A first section of the first locating pin including the end portion located in the first hole is bent with respect to a second section of the first locating pin such that there is an obtuse angle between the first section and second section of the first locating pin, and a first section of the second locating pin including the end portion located in the second hole is bent with respect to a second section of the second locating pin such that there is an obtuse angle between the first section and second section of the second locating pin.

BRIEF DESCRIPTION OF THE SEVERAL VIEWS OF THE DRAWING(S)

DETAILED DESCRIPTION OF THE INVENTION

Figure 1:
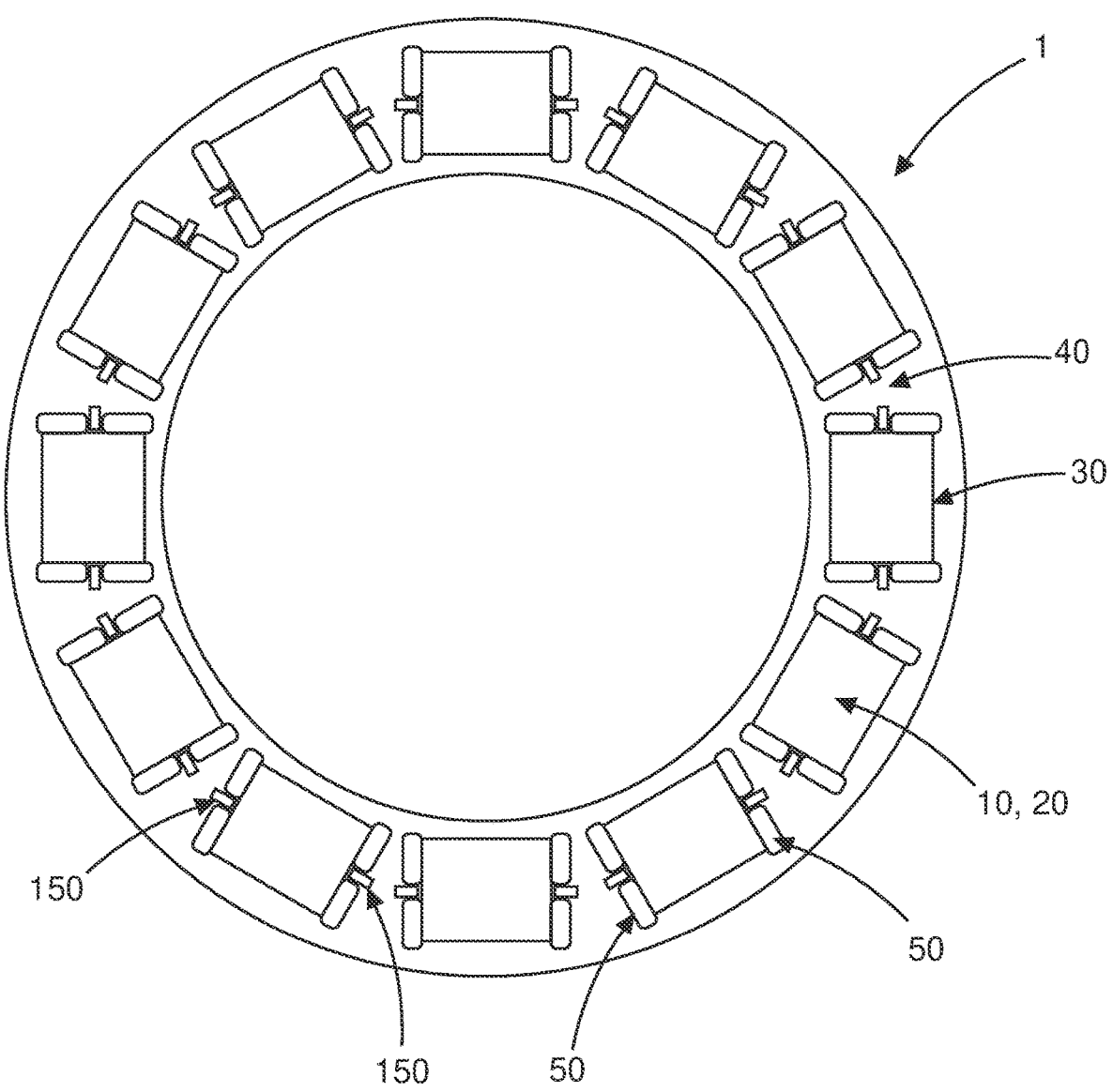
FIG. 1 is an outline view of an exemplary current sensing device with a plurality of exemplar coil elements in accordance with the disclosure.

FIGS. 1-5 relate to a current sensing device and a method of manufacturing a current sensing device. In an example, a current sensing device comprises a substrate 40, and one or more coil elements 30. The substrate comprises a plurality of holes 100 projecting at least part way through the substrate from a first surface of the substrate. The holes 100 can go all the way through the substrate. Prior to a coil element being mounted to the substrate each of the plurality holes has a circular cross section. The coil element comprises: a winding body 10, 20, two flanges 50 located at either end of the winding body, a length of wire 80), and two locating pins 60. The winding body has an outer surface around an axis of the winding body, and at least a portion of the length of wire is wound multiple times around the outer surface of the winding body in a generally circumferential direction with respect to the axis of the winding body. The wire wound in this way can be termed a winding segment. When the coil element is mounted to the first surface of the substrate, a first locating pin of the two locating pins is engaged in at least one locating cavity 130, 140, 250, 260 of a first flange of the two flanges and an end portion of the first locating pin of the two locating pins is located in a first hole of the plurality of holes, a second locating pin of the two locating pins is engaged in at least one locating cavity 130, 140, 250, 260 of a second flange of the two flanges and an end portion of the second locating pin is located in a second hole of the plurality of holes, a first section 170 of the first locating pin including the end portion located in the first hole is bent with respect to a second section of the first locating pin such that there is an obtuse angle between the first section and second section of the first locating pin, and a first section (170) of the second locating pin including the end portion located in the second hole is bent with respect to a second section of the second locating pin such that there is an obtuse angle between the first section and second section of the second locating pin.

In this way, not only is the coil element fixed effectively and securely to the substrate, it can be accurately located with respect to the holes in the substrate. It is relatively simple to accurately make circular holes in a substrate, but up until now it has been difficult to locate a coil element accurately with respect to such holes. However, the new development described here enables this to be done.

In other words, holes for locating a coil element on a substrate can be very accurately made. However, in the past when a coil element was mounted to a substrate, there was always a variation in exactly where the winding body, with wire wound around it that constitutes a wire segment, was positioned with respect to the holes, and thus signals from coil elements would vary for a current sensing device. However, the locating pins of a coil element can be forced to engage with the same part of holes, and this means that the coil elements are positioned accurately and reproducibly with respect to the holes in the substrate. Thus, the coil element can be accurately positioned laterally and longitudinally on the substrate, improving consistency of signals, and where a series of coil elements are mounted on the substrate, in for example a Rogowski coil configuration, the signal from each coil element will be consistent with the signals from the other coil elements. This improves the immunity of the current sensing device against interfering magnetic fields from external sources and improves accuracy of the current sensing device and improves reproducibility of signals between current sensing devices, such that a sensing device can be replaced with a different sensing device and will provide signals consistent with the previous sensing device, and reference or calibration data sets can be applied to all the sensing devices and each sensing device does not need to have its own reference data set or calibration data set. A calibration data set can be provided for example when the signal of the current sensing device is utilized for determining electrical power and/or electrical energy with very high accuracy. Thus, different devices can be utilized to diagnose situations, based on signal detection, that that particular device has not been calibrated to diagnose, but can use data acquired by a different device.

In an example, the winding body and two flanges are formed as a single piece, which can be termed a bobbin. In an example, the two flanges are fixedly connected to the winding body. In an example, the substrate is a printed circuit board (PCB). In an example, each flange is arranged perpendicular to the axis of the winding body.

According to an example, the obtuse angle between the first section and second section of the first locating pin is in a direction toward the second locating pin, and the obtuse angle between the first section and second section of the second locating pin is in a direction toward the first locating pin.

Thus, in circular cross section holes, where the cross section of the locating pins is necessarily smaller that the holes in order to be able to inserted into the holes, as the locating pins are bent towards each other the inner part of the locating pins are forced to engage with exact engagement parts of the inner part of the holes in the substrate that in effect form a line extending from the center of both holes and through the center of both engagement parts. Thus, the locating pins and therefore the coil element and its winding body and wire wound around the winding body can be located accurately with respect to holes in the substrate.

Figure 2A:
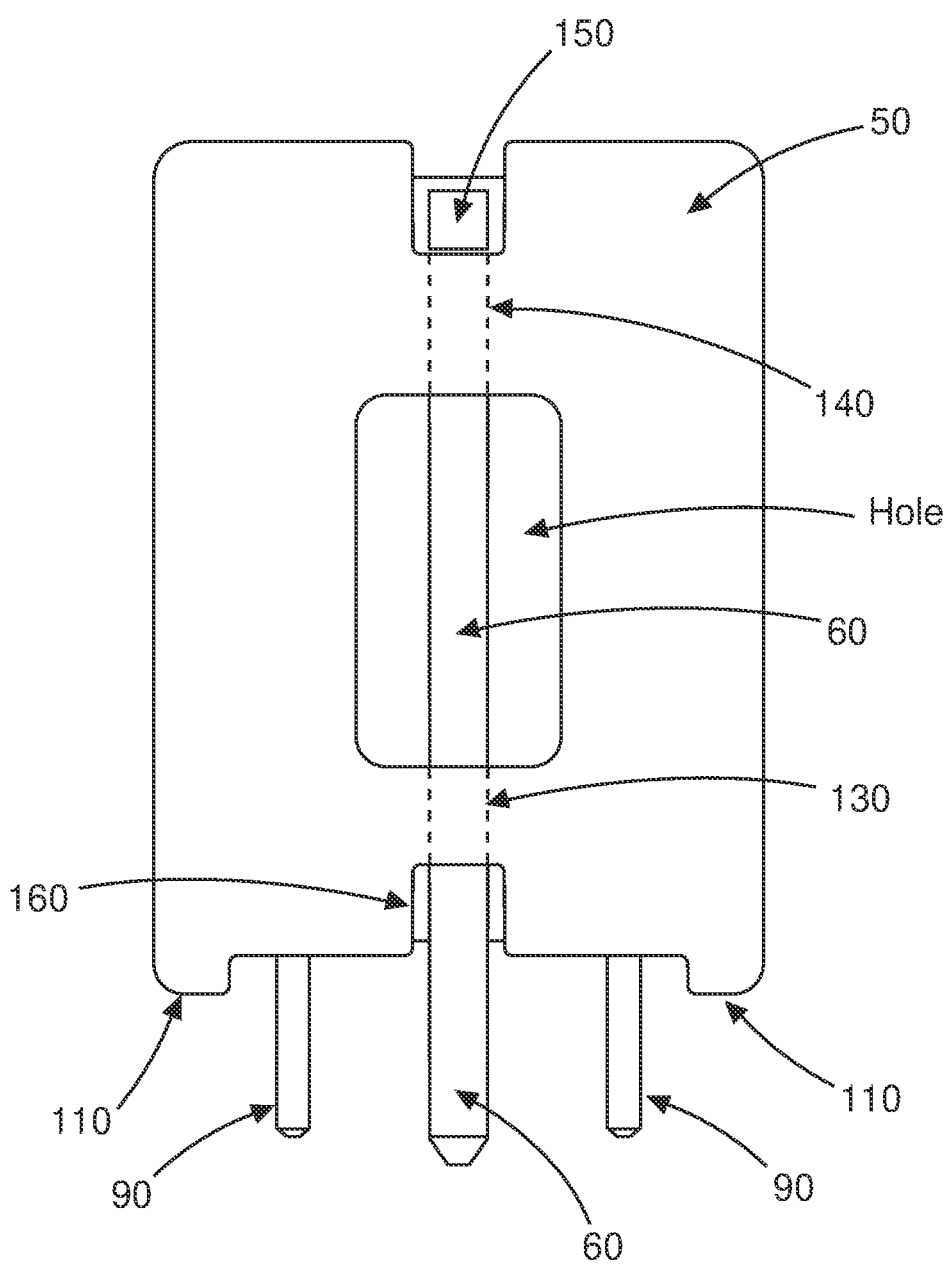
FIG. 2A shows an end view of an exemplar coil element in accordance with the disclosure.
Figure 2B:
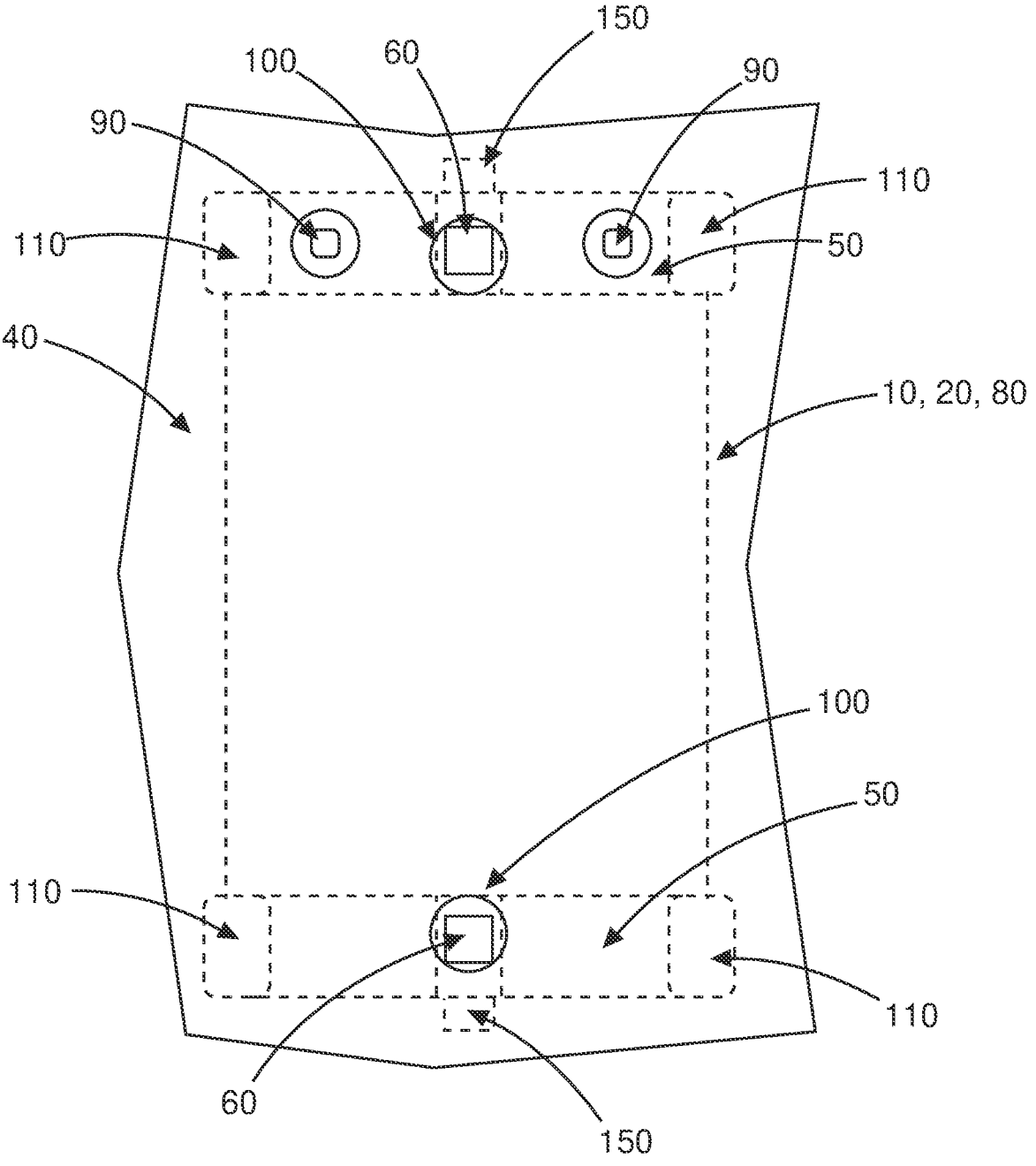
FIG. 2B shows a view of an exemplar current sensing device viewing a second surface of a substrate and where a coil element is mounted to a first surface of the substrate in accordance with the disclosure.
Figure 2C:
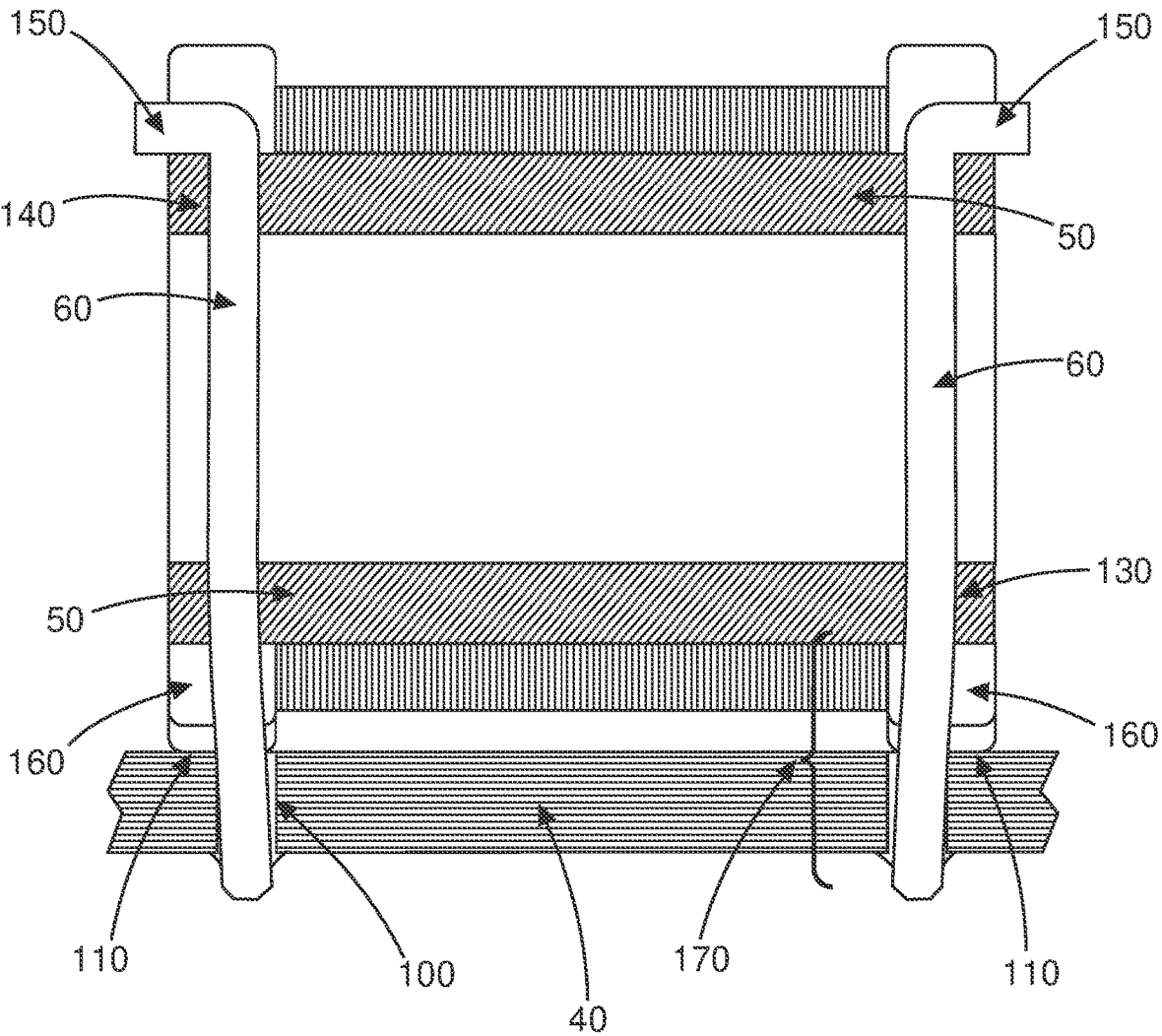
FIG. 2C shows a cross-sectional view of an exemplar coil element mounted to a first surface of a substrate in accordance with the disclosure.
Figure 3A:
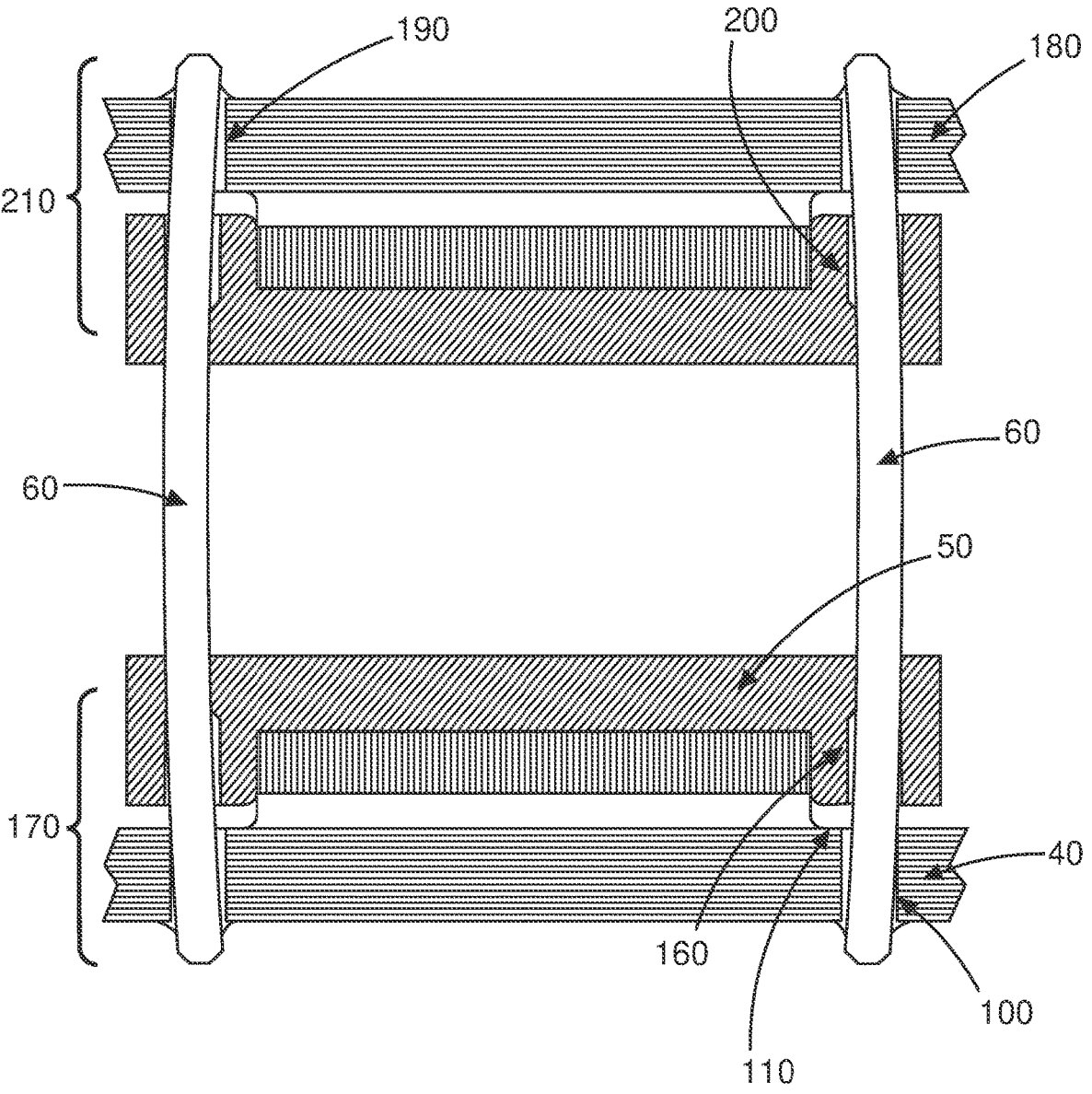
FIG. 3A shows a cross-sectional view of an exemplar coil element mounted to a first surface of a first substrate and mounted to a first surface of a second substrate in accordance with the disclosure.
Figure 4:
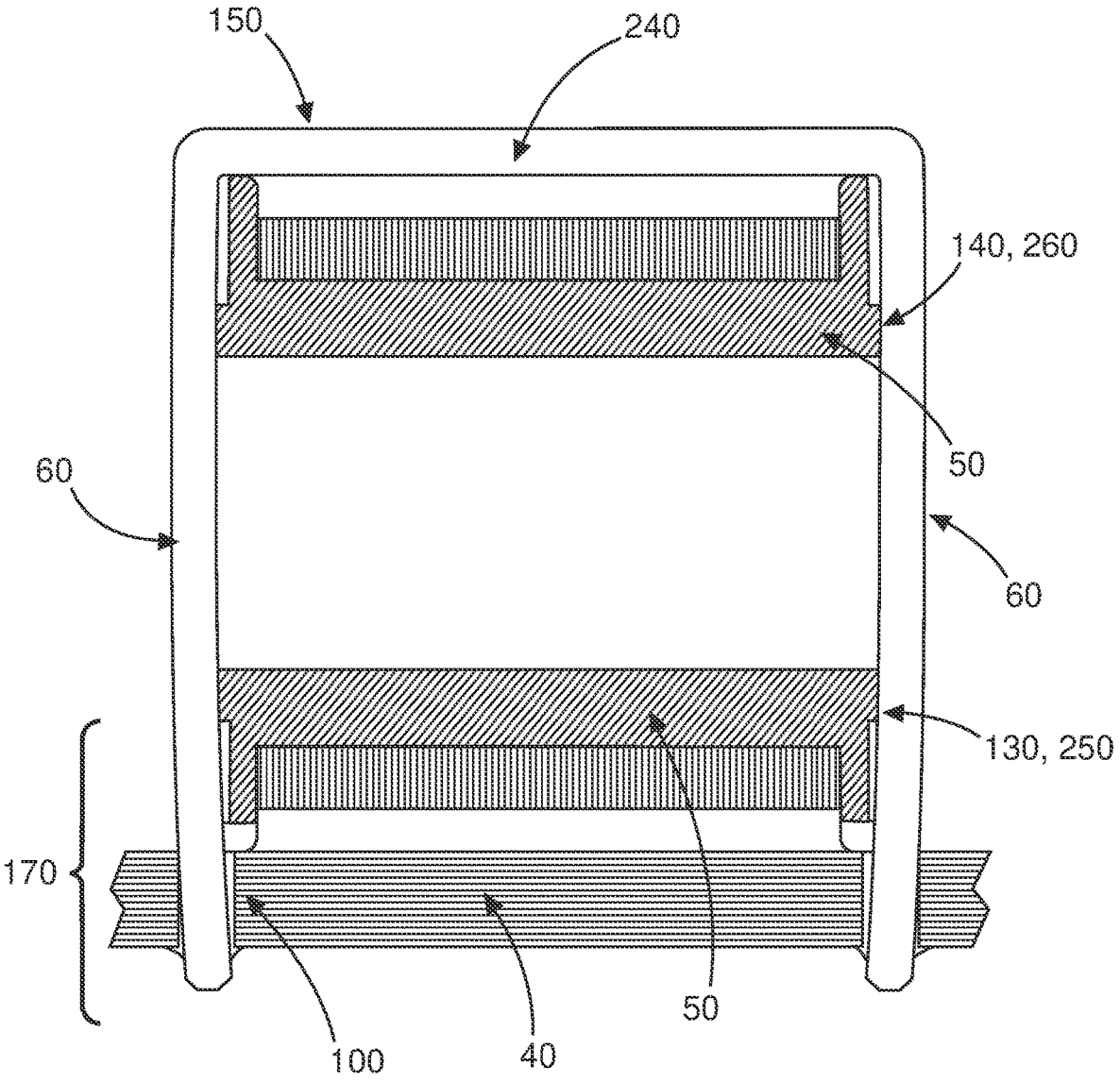
FIG. 4 shows a cross-sectional view of an exemplar coil element mounted to a first surface of a substrate in accordance with the disclosure.

Such examples are shown in FIGS. 2C, 3A and 4, the ends of the locating pins have been bent inwards, thereby providing for accurate positioning of the coil element on the substrate and at the same time secure fixation of the coil element to the substrate.

In an example, the obtuse angle between the first section and second section of the first locating pin is in a direction away from the second locating pin, and the obtuse angle between the first section and second section of the second locating pin is in a direction away from the first locating pin. Thus in the examples shown in FIGS. 2C, 3A and 4, the ends of the locating pins have been bent inwards, however they could be bent outwards and this also provides for accurate positioning of the coil element on the substrate and again at the same time secure fixation of the coil element to the substrate.

According to an example, an angle between the first section and second section of the first locating pin is increased in magnitude to form the obtuse angle between the first section and second section of the first locating pin as a consequence of the first locating pin having been located in the first hole of the plurality of holes in the substrate. At the same time an angle between the first section and second section of the second locating pin is increased in magnitude to form the obtuse angle between the first section and second section of the second locating pin as a consequence of the second locating pin having been located in the second hole of the plurality of holes in the substrate.

Figure 5:
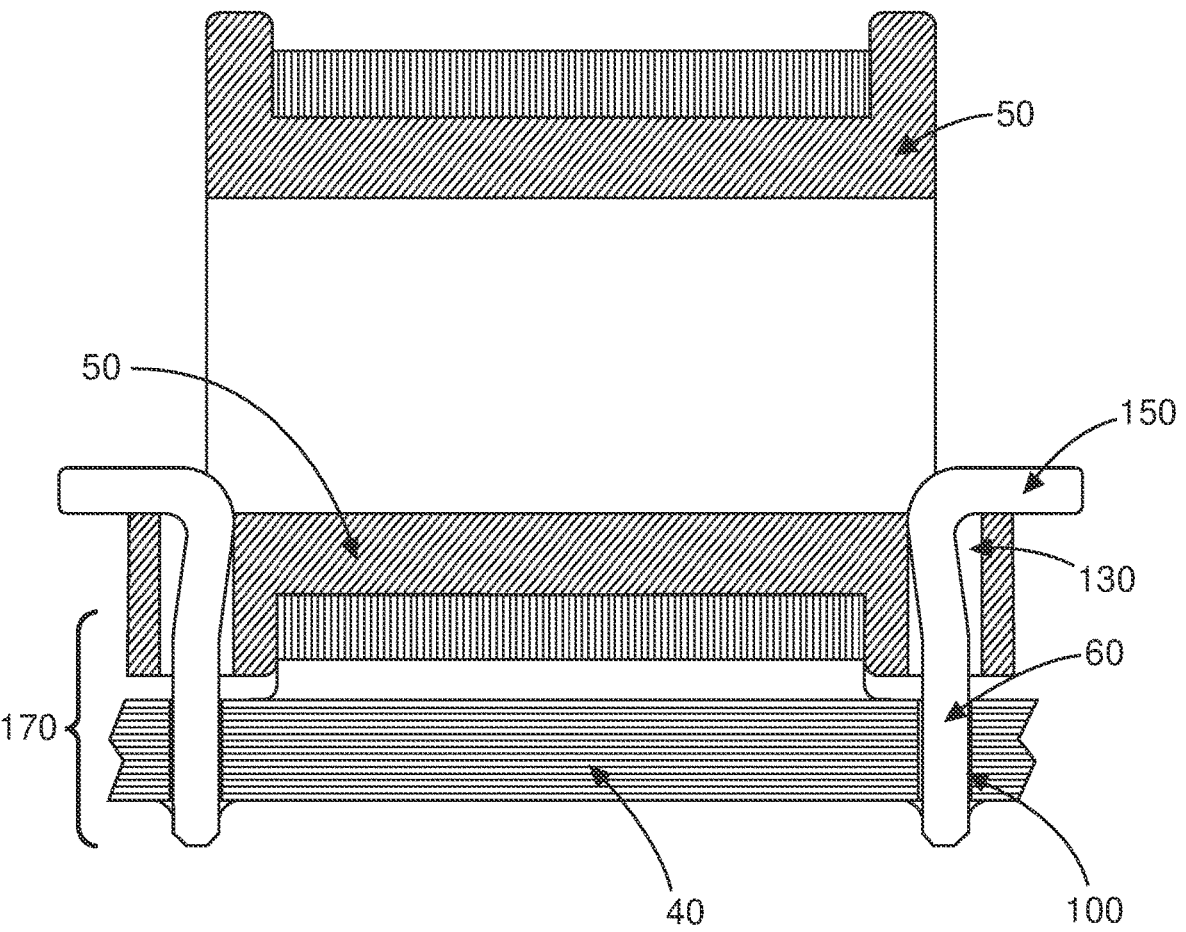
FIG. 5 shows a cross-sectional view of an exemplar coil element mounted to a first surface of a substrate in accordance with the disclosure.

In other words, the locating pins are already bent before being inserted into the holes in the substrate, but become forced into a slightly straighter shapes and bent outwards as they are inserted into the holes and provide a locking capability with the substrate. Such an example is shown in FIG. 5.

In an example, the at least one locating cavity is a hole 130 going through each flange.

According to an example, an angle between the first section and second section of the first locating pin is increased in magnitude to form the obtuse angle between the first section and second section of the first locating pin as a consequence of the first locating pin having been located in the first hole of the plurality of holes in the substrate or a straight section of the first locating pin is bent to form the obtuse angle between the first section and second section of the first locating pin as a consequence of the first locating pin having been located in the first hole of the plurality of holes in the substrate. At the same time, an angle between the first section and second section of the second locating pin is increased in magnitude to form the obtuse angle between the first section and second section of the second locating pin as a consequence of the second locating pin having been located in the second hole of the plurality of holes in the substrate or a straight section of the second locating pin is bent to form the obtuse angle between the first section and second section of the second locating pin as a consequence of the second locating pin having been located in the second hole of the plurality of holes in the substrate.

In other words, the locating pins are straight or only slightly bent before being inserted into the holes in the substrate, but become further bent inwards or bent inwards as they are inserted into the holes because they are spaced apart slightly more than the spacing between the holes, and the bent locking pins and provide a locking capability with the substrate. Such examples are shown in FIGS. 2C, 3A and 4.

However, the locking pins could be bent outwards rather than being bent inwards, as shown in these figures where the locking pins are spaced apart slightly less than the holes in the substrate and are therefore bent outwards as they are inserted into their respective holes in the substrate.

According to an example, the at least one locating cavity in each flange comprises a first locating portion 130, 250 and a second locating portion 140, 260. When the coil element is mounted to the first surface of the substrate the first locating portion 130, 250 is a part of the flange adjacent to the substrate and the second locating portion 140, 260 is a part of the flange further from the substrate than the first locating portion. The at least one locating cavity is at least one hole going through each flange or at least one groove in each flange.

In this way, the locating pins can be securely held by the coil element and can be orientated vertically to the substrate prior to being bent as the locating pins are inserted into the substrate and bent. The locating pins can move vertically within the locating cavities of the respective flanges. Thus, the coil element can be positioned at the correct location with respect to holes on a substrate, and can be placed on the surface of the substrate. Then locating pins can be inserted through the locating cavities towards the substrate and as the ends go into the holes, the ends of the locating pins are bent (for example inwards-but could be outwards) because a locating pin engages on one side of the pin with one side of the hole into which it is being inserted and at the same time the other pin engages on one side of the pin with one side of the hole (the engagement parts of the holes are either both on the far sides of the hole to each other or on the near sides of the holes to each other). Thus, as both locating pins are inserted into the holes they are bent inwards (or outwards) and in effect grip the substrate. The pins are inserted until a locking anchor at the end of the locking pin opposite to the end that is being inserted into the substrate is pushed down onto the top of the flange. In this way, the coil element is very accurately positioned on the substrate with respect to the holes, which can themselves be very accurately located, and the coil element is very securely fixed to the substrate and cannot move laterally or vertically. The locking pins need not have a locking anchor, but the end not inserted into the substrate can be same as the end that was inserted into the substrate. Then a second substrate 180, in effect identical to the first substrate 40 can be aligned with the locating pins such that two holes that were spaced equivalently to the two holes in the first substrate are aligned with the locating pins, but where the two locating pins are again off to opposing sides of each hole. Then as the second substrate is pushed downwards the locking pins again are inserted into the holes in the second substrate and both are bent inwards, or both are bent outwards, locking the coil element to the second substrate. The second substrate can be pushed down until it touches the top of the coil element, such that the coil element sits on a surface of the first substrate and is securely fixed to the first substrate and the coil element sits on a surface of the second substrate and is securely fixed to the second substrate.

In further specific detail, the coil element can be positioned and placed to the first surface of the substrate whilst the locating pins are inserted into the holes of the substrate. For example, an insertion tool acting on the coil element, or on the coil element and the locating pins, or on the locating pins can be utilized. Whilst inserted, the locating pins can preserve their vertical positions within the locating cavities of the respective flanges. The locating pins can move vertically within the locating cavities of the respective flanges. For example, the locating pins may be moved with a small stroke whilst inserted into the holes of the substrate, in a case where the ends of the pins are employed to achieve a prepositioning of the coil element to the substrate. In other example, prepositioning of the coil element to the substrate is achieved with other means and the locating pins may be moved with a larger stroke through the locating cavities towards the substrate.

According to an example, when the coil element is mounted to the first surface of the substrate and the end portion of the first locating pin of the two locating pins is located in the first hole of the plurality of holes of the substrate at least a part of the second section of the first locating pin is engaged with the first locating portion and the second locating portion of the first flange. When the coil element is mounted to the first surface of the substrate and the end portion of the second locating pin of the two locating pins is located in the second hole of the plurality of holes of the substrate at least a part of the second section of the second locating pin is engaged with the first locating portion and the second locating portion of the second flange.

According to an example, when the coil element is mounted to the first surface of the substrate and the end portion of the first locating pin of the two locating pins is located in the first hole of the plurality of holes of the substrate the second section of the first locating pin is perpendicular to the first surface of the substrate. When the coil element is mounted to the first surface of the substrate and the end portion of the second locating pin of the two locating pins is located in the second hole of the plurality of holes of the substrate the second section of the second locating pin is perpendicular to the first surface of the substrate.

According to an example, each flange comprises two supporting edges 110 at opposite ends of one side of the flange, and when the coil element is mounted to the first surface of the substrate the two supporting edges of each flange are in contact with the first surface of the substrate. In this way a predetermined distance of the winding body and wire with respect to the substrate can be ensured.

In this way, the supporting edges support the coil element on the substrate and ensure a predetermined spacing between the winding body, upon which the wire has been wound, the wound wire can also be termed a winding segment, and the substrate. Thus, the coil element can be accurately positioned vertically with respect to the substrate, improving consistency of signals, and where a series of coil elements are mounted on the substrate, in for example a Rogowski coil configuration, the signal from each coil element will be consistent with the signals from the other coil elements. This improves accuracy of the current sensing device and improves reproducibility of signals between current sensing devices, such that a sensing device can be replaced with a different sensing device and will provide signals consistent with the previous sensing device, and reference or calibration data sets can be applied to all the sensing devices and each sensing device does not need to have its own reference data set or calibration data set. A calibration data set can be provided for example when the signal of the current sensing device is utilized for determining electrical power and/or electrical energy with very high accuracy. Thus, different devices can be utilized to diagnose situations, based on signal detection, that that particular device has not been calibrated to diagnose, but can use data acquired by a different device.

According to an example, each flange comprises a recess or releasing hollow 160 adjacent to one end of the locating cavity of the flange, and when the coil element is mounted to the first surface of the substrate the recess or releasing hollow is at a location adjacent to the first surface of the substrate.

In an example, the first flange comprises at least one recessed portion 120 adjacent to the recess or releasing hollow of the first flange, and the second flange comprises at least one recessed portion 120 adjacent to the recess or releasing hollow of the second flange. When the coil element is mounted to the first surface of the substrate a surface of the flange within the recessed portion of each flange facing the first surface of the substrate is spaced from the first surface of the substrate.

The recess or releasing hollow 160 enables a locating pin to bend and/or deform more than it could if there was no recess or releasing hollow. The recess 120 further enables a locating pin to bend and/or deform more than it could if there was no recess 120. These recesses address the issues of manufacturing errors or tolerances, providing for reliable and economic manufacturability.

In an example, when the coil element is mounted to the first surface of the substrate and the end portions of the locating pins are located in their respective holes of the substrate the locating pin within the recess or releasing hollow of each flange does not touch the flange except where the recess or releasing hollow is joined to the at least one locating cavity.

The recess or releasing hollow 160 also enables a locating pin to bend and/or deform fully and form a close connection with the substrate in order to securely fix the coil element to the substrate.

According to an example, the two locking pins comprise at least one locking anchor 150, 240 configured to stop the two flanges from moving perpendicularly away from the first surface of the substrate.

Thus, when the coil element is mounted to the first surface of the substrate and the end portions of the locating pins are located in their respective holes of the substrate, the other end of the locking pin can have a locking anchor that engages with the flange for that locking pin stopping the flange moving away from the substrate, because the other end is fixed into the hole in the substrate and the locking anchor stops the flange moving with respect to the locking pin.

According to an example, the first locating pin comprises a locking anchor 150, and when the coil element is mounted to the first surface of the substrate and the end portion of the first locating pin of the two locating pins is located in the first hole of the plurality of holes of the substrate a portion of the locking anchor is located adjacent to a surface of the first flange facing away from the first surface of the substrate. The second locating pin comprises a locking anchor 150, and when the coil element is mounted to the first surface of the substrate and the end portion of the second locating pin of the two locating pins is located in the second hole of the plurality of holes of the substrate a portion of the locking anchor is located adjacent to a surface of the second flange facing away from the first surface of the substrate. This is shown in FIGS. 2A, 2C and 5.

According to an example, the locking anchor 240 is formed from a bridge part connecting the first locating pin to the second locating pin. When the coil element is mounted to the first surface of the substrate and the end portions of the locating pins are located in their respective holes of the substrate a portion of the bridge part is located adjacent to a surface of the first flange facing away from the first surface of the substrate and a portion of the bridge part is located adjacent to a surface of the second flange facing away from the first surface of the substrate. This is shown in FIG. 4. In this way, the two locking pins are equivalent to a staple, that could then sits in locating cavies that are in the form of grooves, because the locating pins only need to be supported on the inside by the two flanges and do not need to be supported outside because they are inhibited by moving with respect to each other by a bridge part connecting them. This enables the flanges to be thinner than they have to be if the locating cavities are holes going through the flanges, and for a set number of coil elements located in a Rogowski coil configuration the length of the winding body can be increased for a set length of coil element, because the two flanges are thinner, enabling a larger signal per coil element to be generated and thus less noise, and a more accurate device is made possible.

According to an example, the current sensing device further comprises a second substrate 180. The second substrate comprises a plurality of holes 140 projecting at least part way through the second substrate from a first surface of the second substrate. The holes in the second substrate can extend through the second substrate. Prior to the coil element being mounted to the second substrate each of the plurality of holes has a circular cross section.

When the coil element is mounted to the first surface of the second substrate, a second end portion of the first locating pin of the two locating pins is located in a first hole of the plurality of holes in the second substrate, a second end portion of the second locating pin of the two locating pins is located in a second hole of the plurality of holes in the second substrate, a third section 210 of the first locating pin including the second end portion located in the first hole in the second substrate is bent with respect to the second section of the first locating pin such that an obtuse angle between the third section and second section of the first locating pin is in the direction of the second locating pin, and a third section 210 of the second locating pin including the end portion located in the second hole in the second substrate is bent with respect to a second section of the second locating pin such that an obtuse angle between the third section and second section of the second locating pin is in the direction of the first locating pin. This is shown in FIG. 3A. Using a second substrate, such as a PCB, provides further improved stability and precision for the positioning of the coil element or elements.

In an example, an angle between the third section and second section of the first locating pin is increased in magnitude to form the obtuse angle between the third section and second section of the first locating pin as a consequence of the first locating pin having been located in the first hole of the plurality of holes in the second substrate.

In an example, an angle between the third section and second section of the second locating pin is increased in magnitude to form the obtuse angle between the third section and second section of the second locating pin as a consequence of the second locating pin having been located in the first hole of the plurality of holes in the second substrate.

In an example, an angle between the third section and second section of the first locating pin is increased in magnitude to form the obtuse angle between the third section and second section of the first locating pin as a consequence of the first locating pin having been located in the first hole of the plurality of holes in the second substrate or a straight section of the first locating pin is bent to form the obtuse angle between the third section and second section of the first locating pin as a consequence of the first locating pin having been located in the first hole of the plurality of holes in the second substrate.

In an example, an angle between the third section and second section of the second locating pin is increased in magnitude to form the obtuse angle between the third section and second section of the second locating pin as a consequence of the first locating pin having been located in the first hole of the plurality of holes in the second substrate or a straight section of the second locating pin is bent to form the obtuse angle between the third section and second section of the second locating pin as a consequence of the first locating pin having been located in the first hole of the plurality of holes in the second substrate According to an example, prior to the locating pins being located into the holes 100 in the substrate 40 the coil element is configured such that the two locating pins can move within their respective at least one locating cavity in a direction perpendicular to the axis of the winding body. Thus, the coil element can be positioned on the substrate at the correct position with respect to holes in the substrate. Then the locating pins can be pushed within their locating cavities such that the end of the locating pin becomes bent as it goes into the hole and securely fixes the coil element to the substrate. This enables the coil element to be very precisely positioned on the substrate and then fixed precisely at that location.

In an example, the locating pins can be extracted from the substrate to remove a coil element from the substrate through applying a sufficient upward force that straightens the locating pins as they are pulled perpendicularly away from the substrate and the ends of the locating pins are pulled out of their respective holes and are straightened to a certain extent in this occurring.

According to an example, the current sensing device comprises a plurality of coil elements mounted to the substrate. Each of the coil elements can be configured as described above with respect to the above described coil element and mounted to the substrate as described above for the coil element. In an example, the current sensing device is configured as a Rogowski coil.

From the above description of this current sensing device, in its different possible examples, a clear teaching is provided regarding a method of manufacturing such a current sensing device, in its different examples. The accuracy of the measurement voltage depends on the position accuracy of each winding segment and they developed a new way to mount the coil elements to a substrate in precise positions. This allows manufacturing a device with compact size, high accuracy, high reliability, high productivity, and low manufacturing cost.

High measurement accuracy is ensured by the precise position of the coil elements around the conductor carrying the current to be measured. This is achieved by precisely positioning a coil element on a substrate using locating pins and retaining holes. The locating pins and the retaining holes are configured to provide an accurate guiding effect of the coil element during engagement by providing small overlaps between edges of the pins and inner walls of the retaining holes, where the overlaps cause pressing forces on the locating pins of a coil element having projections in the plane of the substrate which are oriented at least partly in opposite directions. Touch surfaces between locating pins and walls are created upon engagement, where the touch surfaces are distributed to lock the coil element in any direction in the plane of the substrate. Good positioning stability in the plane of the substrate is ensured by providing the touch surfaces close to extremities of the coil element.

The positioning accuracy and the cost are optimized by reducing the impact of manufacturing tolerances on positioning accuracy. This is achieved by enabling small deformations of the locating pins and of the retaining holes to occur during engagement. Small deformations of a locating pin are facilitated by using a locating pin made of a metal alloy and by providing a releasing hollow around the locating pin where the locating pin can deform to align with a retaining hole in the substrate. Providing a releasing hollow where the locating pin can bend is particularly effective. The shape and the dimensions of the releasing hollow, the dimensions and the material of the locating pin are practical design parameter to control the bending behavior of the locating pin.

Further, a locating pin is preferably provided with a sharp positioning edge to be engaged against an inner wall of a retaining hole. A sharp positioning edge cause material to be locally removed or displaced relatively easy from the wall of the retaining hole of from the edge itself during engagement. For example, the sharp positioning edge may cut a dint in the wall of the retaining hole.

Retaining forces between inner walls of retaining holes and locating pins of a coil element take place, for example because of friction, and provide positioning stability of the coil element in a direction perpendicular to the plane of the substrate.

Very robust fixation of the coil element to the substrate is achieved by providing locking anchors on the locating pins. The accurate position of the coil element to the substrate is thus reliably maintained over long operating lifetime and in harsh environments. The device can withstand mechanical stresses, vibrations, or shocks while providing high measurement accuracy.

Low manufacturing cost is achieved using locking anchors which are easy to produce like a head of the locating pin, or a deformation of the locating pin, or a pin segment having specific orientation or shape, or a soldered locking anchor. Soldered locking anchors are particularly easy to implement using a PCB substrate and locating pins made of a copper containing alloy.

Production of linear coil elements and assembly of the coil elements on PCB substrates are suitable for high productivity and low cost, for example by using proven automated techniques. Low cost is achieved by providing a relatively simple PCB substrate with multiple functionalities: mechanical support, accurate positioning, electrical connectivity, electrical shielding, etc.

Retaining holes with round shape can be produced with high precision and low cost in practically any type of substrate, being very beneficial in PCB substrate where drilling is the lowest cost and highest precision option for producing holes.

It is also to be noted that the retaining holes can be of various shape like circular, oval, trapezoid, polygonal with rounded corners, or combinations of the above. They can be produced for example by milling, punching, or laser cutting.

Locating pins made of metal have relatively high stiffness and small cross-section can be effectively employed. The cross-section of the locating pins can be of various shapes like square, rectangular, hexagonal, star, circular, etc. They occupy thus little space into the coil element and the coil elements can be arranged densely which is beneficial for reaching high accuracy and compact size of the device. Compact size of the device is also achieved by a substrate which is preferably planar and thin.

The positioning accuracy of the coil elements and the stability of the device are further improved by providing a second substrate to lock the coil elements between the substrates. The locating pins can be provided with soldered locking anchors to each PCB substrate, and the locating pins may also feature electrical connectivity functionality, e.g. for connecting conductive planes provided on the PCBs for electrical shielding. The accuracy and the reliability of the measurement is further improved by providing practical electrical shielding on the PCB substrates. The cost is also reduced by eliminating the need of specific means for electrical shielding, such as using an electrically conductive enclosure for the device.

The coil elements are distributed in a polygonal closed path. They can be uniformly distributed to form a regular polygon. Practical cost and accuracy tradeoffs are achieved using preferably between 6 and 32 coil elements. However, any number of coil elements equal or greater than 2 can be employed. In the case of larger devices, the substrate may comprise multiple substrate segments.

The current sensing devices and methods of manufacturing current sensing devices are described in further detail with respect to specific embodiments.

FIG. 1 shows a current sensing device with 12 coil elements 30 mounted on a substrate 40 and being uniformly distributed in a closed path around an opening provided in the substrate for a conductor carrying a current to be sensed. Practical cost and accuracy tradeoffs are achieved using preferably between 6 and 32 coil elements. A coil element 30 comprises a winding segment with a plurality of turns of wire 80 applied on a winding body 10, 20 of a bobbin. There are two flanges 50 at either end of the winding body, and locking anchors 150 of locating pins 60 are shown.

Figure 3B:
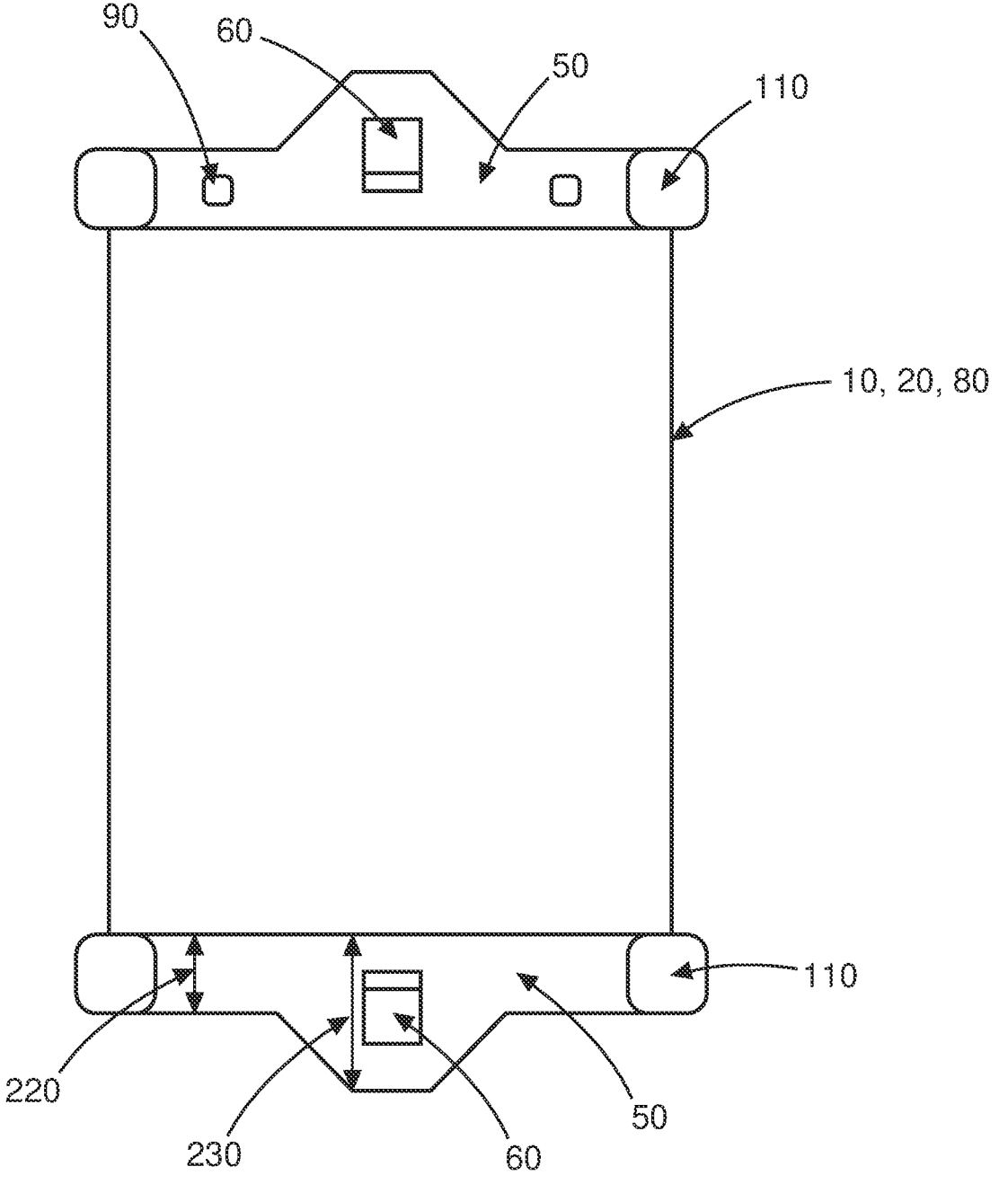
FIG. 3B shows a plan view of an exemplar coil element in accordance with the disclosure.

The locating pins 60 can move up and down within locating cavities 130, 140, 250, 260 in the flanges 50 of each coil element 30 and the PCB 40 has mating retaining holes 100 that are configured to precisely position the coil element to the PCB and to hold the coil element to the PCB with a retaining force. The locating pins 60 are shown in FIGS. 2A, 2B, 2C, 3A, 3B, 4 and 5. The locating pins can be used to fix to only one substrate 40 and have a locking anchor 150 at an end of the locating pins that is not inserted into the substrate, as shown in FIGS. 2A, 2B, 2C, 4 and 5. However, one end of the locating pins 60 can be inserted into holes 100 in a first substrate and the other end of the locating pins can be inserted into holes 190 in a second substrate 180, as shown in FIGS. 3A and 3B. Thus, looking at FIG. 1 there can be just one annular shaped PCB 40 with coil elements 30 mounted to it or there can be two parallel and annular shaped PCBs 40 with coil elements 30 between them. The two PCBs 40 can be locked together with locking pins, or the locating pins themselves can lock the two substrates together.

The winding body 10, 20 can be of any shape as required. For example, a winding body 10 can be generally rectangular in cross section, with rounded corners and with two opposing sides have flat sections and the other two opposing sides have no flat sections and being curved to a certain extent. For example, a winding body 20 can be generally rectangular in cross section, with rounded corners and with two opposing sides having no flat sections and being curved to a certain extent, and the other two opposing sides have no flat sections and being curved to a certain extent.

Thus, continuing with FIG. 1 this shows a current sensing device 1 with 12 coil elements 30 mounted on a substrate 40 and being uniformly distributed in a closed path around an opening provided in the substrate for a conductor carrying a current to be sensed. Practical cost and accuracy tradeoffs are achieved using preferably between 6 and 32 coil elements 30. A coil element 30 comprises a winding segment applied on a winding body 10, 20 of a bobbin, where two flanges 50 delimit the winding segment, and there are two connecting pins 90 to connect to both ends of the wire 80. The substrate 40 is preferably a PCB provided with an electrically shielding plane like a ground plane at least on the side opposite to the coil elements 30 and with traces for sensing signals mainly on the side facing the coil elements 30. Each coil element has associated locating pins 60 that fix the coil element to the PCB substrate 40 via mating retaining holes 100.

FIG. 2A shows a view from the outer side of a flange 50 of a coil element 30. The coil element has 2 supporting edges 110 at the bottom lateral sides of the flange and a locating pin 60 approximately in the middle of the flange. The supporting edges are configured to support the coil element on the substrate 40 and to ensure a predetermined spacing between the winding segment, formed from wire 80 wound around the winding body 10, 20, and the substrate 40. The coil element comprises two connecting pins 90 to which the ends of the winding wire 80 in the winding segment are contacted. The connecting pins are provided at the same flange of the coil element 30, one between each supporting edge and the locating pin. The locating pin is engaged in a locating cavity comprising two cavity portions 130, 140, at the top and respectively at the bottom regions of the flange 50 of the coil element 30. The locating pin 60 comprises an insertable pin portion which in an unmounted state, in particular prior to mounting, has an initial straight shape. At the top side, the locating pin is provided with a locking anchor 150 which locks to a wall of the flange and blocks displacement of the coil element 30 over the top of the locating pin. Each cavity portion 130, 140 comprises a holding hole where the locating pin is held tightly. A holding hole prevents displacement of the locating pin in any direction in a plane given by the supporting edges. The combination of 2 holding holes imposes an improved vertical posture of the locating pin and also facilitates the insertion of the locating pin from the top of the coil element. A releasing hollow 160 is provided around the locating pin between the bottom holding hole and the supporting edges to allow for space where the locating pin can deform to align with a retaining hole in the substrate. The bottom of the flange has a recess portion 120 that further enables the locating pin to deform.

The locating pin is made of a metal alloy, preferably containing copper. It has an approximately square cross-sections with a width typically comprised between 0.3 mm and 3 mm, preferably between 0.5 mm and 1.5 mm. The winding body 10, 20 has a hole down its center, which facilitates winding of the wire 80 around it, via insertion of a jig into the hole, enabling the winding body to be rotated to wind the wire around it.

FIG. 2B shows a portion of a substrate 40 from the opposite side where a coil element 30 is mounted. Thus, looking at FIG. 2B the viewer could be looking at the underside of the current sensing device 1 of FIG. 1, where a coil element 30 is on the other side of the substrate 40 that is being looked at. Mounting is achieved by engaging two locating pins 60 of a coil element 30 into two respective retaining holes 100 of the substrate 40. The coil element 30 holds the locating pins 60 in a fixed position perpendicularly to the substrate 40, for example using locating cavities with holding holes 100. The substrate is flat and the retaining holes have a round shape which is suitable for low cost and precise manufacturing. They are slightly larger than the locating pins, having a diameter typically comprised between 0.5 mm and 5 mm, preferably between 0.7 mm and 2.5 mm. A locating pin 60 is provided on each flange 50 of the winding body 10, 20 of the coil element and each locating pin 60 has two sharp positioning edges in touch with the inner wall of the retaining hole, forming two respective narrow touch surfaces. The width of a narrow touch surface is less than one tenth of the circumference of the hole. A total of four narrow touch surfaces are provided where two narrow touch surfaces at one side of the coil element have approximately orthogonal directions. Two narrow touch surfaces placed diagonally over the coil element have approximately opposite directions. The narrow touch surfaces are configured to block the coil element in any direction in the plane of the substrate. Connecting pins 90, for connecting to the wire 80 wound round the winding body 10, 20 of the coil element 30, are shown either side of a locating pin 60.

The substrate is preferably a PCB having connecting holes sufficiently large to receive the connecting pins without subjecting them to mechanical stress. The PCB is provided with an electrically shielding plane like a ground plane at least on the side opposite to the coil elements and with traces for sensing signals mainly on the side facing the coil elements.

FIG. 2C shows a cross-sectional view along a coil element 30 and a substrate 40 portion in a plane through the region of narrow touch surfaces of two locating pins 60. The narrow touch surfaces are shown in more detail in FIG. 2B. The coil element 30 is similar with the ones shown in FIG. 2A and FIG. 2B. It comprises two locating pins 60 and each locating pin is engaged in a locating cavity 130, 140 of flanges 50 of the coil element and in a retaining hole 100 of the substrate 40. The locating cavities are arranged symmetrically at the longitudinal sides of the coil element. In an initial unmounted state, the locating cavities, the locating pins, and the retaining holes are configured to provide a small overlap between the sharp positioning edges and the inner walls of the retaining holes. Mounting the coil element to the substrate causes pressing forces on the locating pins from inner walls of the holding holes and from inner walls of the retaining holes. The holding holes are in effect the locating cavities 130 and 140 in the form of holes through the parts of the flange 50 with side of the central hole through the winding body 10, 20. These forces have opposite directions and stabilize the position of the coil element in a plane parallel to the substrate. They also cause small deformations of the locating pins like a slight bending taking place in the region of a releasing hollow. A bend causes a slanted position of a locating pin segment 170 passing through the retaining hole-a locating pin 60 is bent inwards towards the other bending pin and in doing so provides a secure fixation to the substrate-however rather than the locating pins in effect being spaced slightly too far apart for the holes 100 in the substrate leading to the ends portions 170 of the locating pins 60 being bent inwards to fix to the substrate as the locating pins are inserted into the holes in the substrate, the holes 100 in the substrate 40 can in effect be spaced slightly too far apart for the locating pins 60 leading to the ends portions 170 of the locating pins 60 being bent outwards away from each other to fix to the substrate as the locating pins are inserted into the holes in the substrate. Where a holding hole, i.e. the lower locating cavity 130 as shown in FIG. 2C, exits the flange 50 a recess or releasing hollow 160 is provided that spaces the locating pin from the flange. This enables the portion 170 of the locating pin 60 to bend inwards without touching an inner part of the flange wall. Bottom parts of the flanges are formed as supporting edges 110 that sit on a first surface of the substrate 40. The spacing between a substrate and a holding hole can be equal to the spacing between the substrate 40 and the winding body 10, 20.

The substrate 40 can be a PCB, where metallization layers are provided on the inner walls of the retaining holes and on rings around the retaining holes. The locating pins can be soldered to the metallization layers to achieve a soldered locking anchor which helps to hold the locating pins 60 firmly to the substrate. At the top side, each locating pin is provided with a locking anchor 150 in the form of a transverse pin segment being transversely oriented with respect to the insertable pin portion of the locating pin 60. The transverse pin segments lock the coil element to the locating pin and thus to the substrate. The coil element is thus held in firm and precise position.

Other small deformations of the engaged parts like locating pins, holding holes, or retaining holes may also occur. Sharp positioning edges and narrow touch surfaces allows for deformations caused by material getting displaced or removed during engagement to happen relatively easy. They enable more intimate contact between the engaged parts and improve the positioning stability of the coil element. Providing the narrow touch surfaces at the outer side of the flange results in a total pressing force on the flange towards the center of the coil element causing compressive stress on the bobbin which is easier to withstand than tear stress.

FIG. 3A shows a cross-sectional view along a coil element 30 and portions of two substrates 40, 180 in a plane through the region of narrow touch surfaces of two locating pins 60. It is an alternative arrangement comprising a second PCB substrate 180, where as described above a first end of a locating pin 60 is inserted into a hole 100 in a first substrate 40 and a portion 170 is bent inwards to fix to the substrate and can be further soldered to provide further fixation to the substrate. However, now the other end of the locating pin does not have an intrinsic locking anchor, but the other end is inserted into a hole 190 in a second substrate, and a portion 210 is bent inwards to fix the second substrate, and can again be soldered to provide further fixation. Again, the flange 50 at the top has a recess or releasing hollow 200 around the upper locating cavity 140 in the form of a hole, that enables the locating pin 60 to be bent inwards towards the other locating pin to fix the locating pin and hence the coil element to the second substrate 180, and where soldering can be used to provide further fixation. Thus, the locating pins can have soldered locking anchors to retaining holes in each PCB 40, 180.

In an unmounted state, in particular prior to mounting, the locating pins 60 have an initial straight shape. After mounting the coil element and the locating pins to the substrates, each locating pin 60 comprises two slight bent portions 170, 210. An enlarged portion of the locating cavity is comprised in each releasing hollow 160, 200 mainly in one direction facing the center of the coil element. The spacing between a PCB and a holding hole is moderately larger than the spacing between the substrate and the winding body.

The locating pins can be employed to connect electrical signals between the PCBs, in particular an electrical shield potential provided on shielding planes of the PCBs. The second PCB 180 can have a construction preferably identical to the first PCB 40, such that they are manufactured in a same batch to result in simple and cheap production. The main differences between the two PCBS would be related to the electrical connections being assembled.

FIG. 3B shows a view from the bottom side of a coil element 30 like the one shown in FIG. 3A. The thickness 220 of a flange is small at the lateral sides, and the thickness 230 is larger near the locating pin. Minimizing the thickness of flanges at least at the side facing the conductor allows maximizing the space occupied by the winding segments of the coil elements and thus improving the sensitivity and accuracy of the current sensing device.

FIG. 4 shows a cross-sectional view along a coil element 30 and a PCB substrate 409 portion in a plane through the region of narrow touch surfaces of two locating pins 60. It is an alternative arrangement where a locating staple 240 comprises the two locating pins 60. The locking anchor 150 is now a pin segment in the crown of the locating staple. Each locating cavity 130, 140, 250, 260 is now a groove provided on each flange 50 (rather than holes going through the flanges 50), which allows a reduction in the thickness of the flanges 50, and thus an increase in the length of the winding body 10, 20 with respect to a fixed length of a coil element 30 and thus to an increase in signal and accuracy. The groove comprises at least two holding groove portions to prevent displacement of the locating staple in any direction in a plane parallel to the substrate. The groove may comprise slanted portions of the wall to better guide the locating pins. Releasing hollows 160 like deeper groove portions are again provided between holding groove portions and the substrate, enabling the end portions 170 of the locking pins 60 to be bent inwards towards each other-however as discussed above in another configuration the locating pins can be bent outwards away from each other.

FIG. 5 shows a cross-sectional view along a coil element 30 and a PCB substrate 40 portion in a plane through the region of narrow touch surfaces of two locating pins 60. It is an alternative arrangement where each locating pin 60 is engaged in a locating cavity 130 like a hole having an approximate constant section, being wider than a section of the locating pin in a longitudinal direction to the coil element. The displacement constraint in longitudinal direction is achieved by providing a curved shape of the locating pin 60. The width of the locating cavity is preferably configured to hold the locating pin in transverse direction to the coil element. It may be provided with a tight cavity portion in transverse direction or with cavity walls guiding the locating pin in a preferred stable position. The thickness of a flange is predominantly small. A flange portion with larger thickness is provided in a bottom region of the flange around a locating cavity. This configuration facilitates the insertion of a locating pin in the locating cavity and allows reaching higher density of winding segments in a current sensing device.

In an unmounted state, in particular prior to mounting, the locating pin is preferably configured to press against inner walls of the locating cavity 130. Mounting the coil element to the substrate causes pressing forces on the locating pins from inner walls of the holding holes and from inner walls of the retaining holes. These forces have opposite directions and stabilize the position of the coil element in a plane parallel to the substrate. The shape of each locating pin is partly altered by engagement in the retaining hole, loosing contact or increasing the separation with the inner wall of the locating cavity at the outer side of the flange. Thus, as the locating pin 60 in inserted into a hole 100 I the substrate 40, the bent locating pin is very slightly straightened such that an end portion 170 becomes slightly less angled to the adjacent part of the locating pin, and the locating pin grips the inner wall of the hole 100 in the substrate. Again, solder can be provided to further increase the fixation. A retaining hole 130 (the locating cavity in the form of a hole through the flange 50) is sized to have comparable dimension with the locating pin 60, in particular resulting in four narrow touch surfaces for the locating pin. The four narrow touch surfaces can provide a holding effect like a locking anchor. The locating pins are also provided with soldered locking anchors to the PCB.

A locking anchor 150 can be a head of the locating pin 60, or a deformation of the locating pin, or a pin segment with different orientation or shape as the insertable pin portion, or a soldered locking anchor.

The spacing between a PCB and a holding hole is preferably comprised between 25% and 175% the spacing between the substrate and the winding body. An improved outcome is generally achieved when the spacing between a PCB and a holding hole is comprised between 50% and 150% the spacing between the substrate and the winding body.

In a general aspect, a current sensing device in accordance with the disclosure in one embodiment comprises a plurality of coil elements mounted on a substrate. A coil element comprises a winding segment applied on a winding body, 2 flanges delimiting the winding segment, 2 connecting pins, and 2 locating pins being engaged in respective retaining holes of the substrate. Each flange has a supporting edge configured to seat the coil element on the substrate and to ensure a predetermined spacing between the winding segment and the substrate. A locating pin is engaged in a locating cavity and they are configured to provide a displacement constraint to limit the displacement of the locating pin at least in one direction in a plane given by the supporting edges. A locating pin is provided with locking anchors to hold the coil element to the substrate. The locating pin is sturdier than a connecting pin and is made of metal.

A releasing hollow is provided between the displacement constraint and the substrate at least at one side of the locating pin, approximately aligned with the 2 locating pins. A locating pin has at least one sharp positioning edge in touch with the inner wall of the retaining hole, forming a narrow touch surface. The width of a narrow touch surface is much smaller than the circumference of the retaining hole. The locating pins, any respective locating cavity, and at least 4 narrow touch surfaces are configured to block the coil element in any direction in the plane and out of the plane of the substrate.

An engaged part comprises a small deformation, in particular the locating pin. The spacing between displacement constraint and the substrate is comparable to the spacing between the winding body and the substrate. The substrate is a PCB comprising electrical connections for the connecting pins and the locating pins have soldered locking anchors to the PCB. The releasing hollow comprises an enlarged portion of the locating cavity. 2 narrow touch surfaces are provided at each flange, preferably at its outer side.

Each flange comprises a locating pin. A flange comprises a supporting edge at each lateral side and a connecting pin between each supporting edge and a locating pin. The locating pin traverses the flange approximately from top to bottom. A connecting pin comprises a segment penetrating the winding body, a bend, and a segment directed to the PCB. A 2nd PCB is provided to hold the coil elements between the PCBs, locating pins have soldered locking anchors to each PCB, preferably connected to shield planes.

The thickness of a flange is larger in the region of a locating pin than at one side of the flange. Thus, the new development relates to a current sensing device for sensing an alternating current with compact size, high reliability, and low manufacturing cost. The current sensing device operates according to the Rogowski coil principle and comprises a plurality of coil elements mounted on a substrate such as a printed circuit board (PCB).

A coil element comprises locating pins and the substrate comprises mating retaining holes and they are configured to precisely position the coil element in a plane parallel to the substrate. A locating pin is engaged in a locating cavity of a coil element and is provided with locking anchors to firmly fix the coil element to the substrate.

The precise and stable position of the coil elements on the substrate ensure high measurement accuracy and reliability. The device is compatible with manufacturing processes having high productivity and low cost such as linear winding and PCB assembly.

In an example, the obtuse angle between the first section and second section of the first locating pin is in a direction toward the second locating pin. In an example, the obtuse angle between the first section and second section of the second locating pin is in a direction toward the first locating pin. In an example, an angle between the first section and second section of the first locating pin is increased in magnitude to form the obtuse angle between the first section and second section of the first locating pin as a consequence of the first locating pin having been located in the first hole of the plurality of holes in the substrate. In an example, an angle between the first section and second section of the second locating pin is increased in magnitude to form the obtuse angle between the first section and second section of the second locating pin as a consequence of the second locating pin having been located in the second hole of the plurality of holes in the substrate.

In an example, an angle between the first section and second section of the first locating pin is increased in magnitude to form the obtuse angle between the first section and second section of the first locating pin as a consequence of the first locating pin having been located in the first hole of the plurality of holes in the substrate or a straight section of the first locating pin is bent to form the obtuse angle between the first section and second section of the first locating pin as a consequence of the first locating pin having been located in the first hole of the plurality of holes in the substrate.

In an example, an angle between the first section and second section of the second locating pin is increased in magnitude to form the obtuse angle between the first section and second section of the second locating pin as a consequence of the second locating pin having been located in the second hole of the plurality of holes in the substrate or a straight section of the second locating pin is bent to form the obtuse angle between the first section and second section of the second locating pin as a consequence of the second locating pin having been located in the second hole of the plurality of holes in the substrate.

In an example, the at least one locating cavity in each flange comprises a first locating portion and a second locating portion. When the coil element is mounted to the first surface of the substrate the first locating portion is a part of the flange adjacent to the substrate and the second locating portion is a part of the flange further from the substrate than the first locating portion. The at least one locating cavity is at least one hole going through each flange or at least one groove in each flange.

In an example, when the coil element is mounted to the first surface of the substrate and the end portion of the first locating pin of the two locating pins is located in the first hole of the plurality of holes of the substrate at least a part of the second section of the first locating pin is engaged with the first locating portion and the second locating portion of the first flange.

In an example, when the coil element is mounted to the first surface of the substrate and the end portion of the second locating pin of the two locating pins is located in the second hole of the plurality of holes of the substrate at least a part of the second section of the second locating pin is engaged with the first locating portion and the second locating portion of the second flange.

In an example, when the coil element is mounted to the first surface of the substrate and the end portion of the first locating pin of the two locating pins is located in the first hole of the plurality of holes of the substrate the second section of the first locating pin is perpendicular to the first surface of the substrate.

In an example, when the coil element is mounted to the first surface of the substrate and the end portion of the second locating pin of the two locating pins is located in the second hole of the plurality of holes of the substrate the second section of the second locating pin is perpendicular to the first surface of the substrate.

In an example, each flange comprises two supporting edges at opposite ends of one side of the flange, and when the coil element is mounted to the first surface of the substrate the two supporting edges of each flange are in contact with the first surface of the substrate.

In an example, each flange comprises a recess or releasing hollow adjacent to one end of the locating cavity of the flange, and when the coil element is mounted to the first surface of the substrate the recess or releasing hollow is at a location adjacent to the first surface of the substrate.

In an example, the two locking pins comprise at least one locking anchor configured to stop the two flanges from moving perpendicularly away from the first surface of the substrate.

In an example, the first locating pin comprises a locking anchor, and when the coil element is mounted to the first surface of the substrate and the end portion of the first locating pin of the two locating pins is located in the first hole of the plurality of holes of the substrate a portion of the locking anchor is located adjacent to a surface of the first flange facing away from the first surface of the substrate.

In an example, the second locating pin comprises a locking anchor, and when the coil element is mounted to the first surface of the substrate and the end portion of the second locating pin of the two locating pins is located in the second hole of the plurality of holes of the substrate a portion of the locking anchor is located adjacent to a surface of the second flange facing away from the first surface of the substrate.

In an example, the locking anchor is formed from a bridge part connecting the first locating pin to the second locating pin. When the coil element is mounted to the first surface of the substrate and the end portions of the locating pins are located in their respective holes of the substrate, a portion of the bridge part is located adjacent to a surface of the first flange facing away from the first surface of the substrate and a portion of the bridge part is located adjacent to a surface of the second flange facing away from the first surface of the substrate.

In an example, the current sensing device comprises a second substrate. The second substrate comprises a plurality of holes projecting at least part way through the second substrate from a first surface of the second substrate. Prior to the coil element being mounted to the second substrate each of the plurality of holes has a circular cross section.

When the coil element is mounted to the first surface of the second substrate, a second end portion of the first locating pin of the two locating pins is located in a first hole of the plurality of holes in the second substrate, a second end portion of the second locating pin of the two locating pins is located in a second hole of the plurality of holes in the second substrate, a third section of the first locating pin including the second end portion located in the first hole in the second substrate is bent with respect to the second section of the first locating pin such that an obtuse angle between the third section and second section of the first locating pin is in the direction of the second locating pin, and a third section of the second locating pin including the end portion located in the second hole in the second substrate is bent with respect to a second section of the second locating pin such that an obtuse angle between the third section and second section of the second locating pin is in the direction of the first locating pin.

In an example, prior to the locating pins being located into the holes in the substrate, the coil element is configured such that the two locating pins can move within their respective at least one locating cavity in a direction perpendicular to the axis of the winding body. In an example, the current sensing device comprises a plurality of coil elements mounted to the substrate.

In a second aspect, there is provided a method of manufacturing a current sensing device comprising mounting the one or more coil elements to the substrate to provide the above described current sensing device of the first aspect.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A current sensing device, comprising:
a substrate; and
one or more coil elements;
wherein the substrate comprises a plurality of holes extending at least partially through the substrate from a first surface of the substrate, wherein prior to a coil element being mounted to the substrate each of the plurality holes has a circular cross section;
wherein the coil element comprises a winding body, two flanges disposed at either end of the winding body, a length of wire, and two locating pins;
wherein the winding body has an outer surface around an axis of the winding body, and wherein at least a portion of the length of wire is wound multiple times around the outer surface of the winding body in a generally circumferential direction with respect to the axis of the winding body;
wherein, when the coil element is mounted to the first surface of the substrate:
a first locating pin of the two locating pins is engaged in at least one locating cavity of a first flange of the two flanges and an end portion of the first locating pin of the two locating pins is located in a first hole of the plurality of holes, and a second locating pin of the two locating pins is engaged in at least one locating cavity of a second flange of the two flanges and an end portion of the second locating pin is located in a second hole of the plurality of holes; and
a first section of the first locating pin including the end portion located in the first hole is bent with respect to a second section of the first locating pin such that there is an obtuse angle between the first section and second section of the first locating pin; and a first section of the second locating pin including the end portion located in the second hole is bent with respect to a second section of the second locating pin such that there is an obtuse angle between the first section and second section of the second locating pin, wherein the two locking pins comprise at least one locking anchor configured to stop the two flanges from moving perpendicularly away from the first surface of the substrate, and wherein the locking anchor is formed from a bridge part connecting the first locating pin to the second locating pin, and wherein when the coil element is mounted to the first surface of the substrate and the end portions of the locating pins are located in their respective holes of the substrate a portion of the bridge part is located adjacent to a surface of the first flange facing away from the first surface of the substrate and a portion of the bridge part is located adjacent to a surface of the second flange facing away from the first surface of the substrate.

2. The current sensing device according to claim 1, wherein the obtuse angle between the first section and second section of the first locating pin is in a direction toward the second locating pin; and wherein the obtuse angle between the first section and second section of the second locating pin is in a direction toward the first locating pin.

3. The current sensing device according to claim 1, wherein an angle between the first section and second section of the first locating pin is increased in magnitude to form the obtuse angle between the first section and second section of the first locating pin as a consequence of the first locating pin having been located in the first hole of the plurality of holes in the substrate; and wherein an angle between the first section and second section of the second locating pin is increased in magnitude to form the obtuse angle between the first section and second section of the second locating pin as a consequence of the second locating pin having been located in the second hole of the plurality of holes in the substrate.

4. The current sensing device according to claim 1, wherein an angle between the first section and second section of the first locating pin is increased in magnitude to form the obtuse angle between the first section and second section of the first locating pin as a consequence of the first locating pin having been located in the first hole of the plurality of holes in the substrate or a straight section of the first locating pin is bent to form the obtuse angle between the first section and second section of the first locating pin as a consequence of the first locating pin having been located in the first hole of the plurality of holes in the substrate; and wherein an angle between the first section and second section of the second locating pin is increased in magnitude to form the obtuse angle between the first section and second section of the second locating pin as a consequence of the second locating pin having been located in the second hole of the plurality of holes in the substrate or a straight section of the second locating pin is bent to form the obtuse angle between the first section and second section of the second locating pin as a consequence of the second locating pin having been located in the second hole of the plurality of holes in the substrate.

5. The current sensing device according to claim 4, wherein the at least one locating cavity in each flange comprises a first locating portion and a second locating portion, wherein when the coil element is mounted to the first surface of the substrate the first locating portion is a part of the flange adjacent to the substrate and the second locating portion is a part of the flange further from the substrate than the first locating portion, and wherein the at least one locating cavity is at least one hole going through each flange or at least one groove in each flange.

6. The current sensing device according to claim 5, wherein when the coil element is mounted to the first surface of the substrate and the end portion of the first locating pin of the two locating pins is located in the first hole of the plurality of holes of the substrate at least a part of the second section of the first locating pin is engaged with the first locating portion and the second locating portion of the first flange, and wherein when the coil element is mounted to the first surface of the substrate and the end portion of the second locating pin of the two locating pins is located in the second hole of the plurality of holes of the substrate at least a part of the second section of the second locating pin is engaged with the first locating portion and the second locating portion of the second flange.

7. The current sensing device according to claim 4, wherein when the coil element is mounted to the first surface of the substrate and the end portion of the first locating pin of the two locating pins is located in the first hole of the plurality of holes of the substrate the second section of the first locating pin is perpendicular to the first surface of the substrate; and wherein when the coil element is mounted to the first surface of the substrate and the end portion of the second locating pin of the two locating pins is located in the second hole of the plurality of holes of the substrate the second section of the second locating pin is perpendicular to the first surface of the substrate.

8. The current sensing device according to claim 1, wherein each flange comprises two supporting edges at opposite ends of one side of the flange, and wherein when the coil element is mounted to the first surface of the substrate the two supporting edges of each flange are in contact with the first surface of the substrate.

9. The current sensing device according to claim 1, wherein each flange comprises a recess or releasing hollow adjacent to one end of the locating cavity of the flange, and wherein when the coil element is mounted to the first surface of the substrate the recess or releasing hollow adjacent to the first surface of the substrate.

10. The current sensing device according to claim 1, wherein the first locating pin comprises a locking anchor, wherein when the coil element is mounted to the first surface of the substrate and the end portion of the first locating pin of the two locating pins is located in the first hole of the plurality of holes of the substrate a portion of the locking anchor is located adjacent to a surface of the first flange facing away from the first surface of the substrate; and wherein the second locating pin comprises a locking anchor, wherein when the coil element is mounted to the first surface of the substrate and the end portion of the second locating pin of the two locating pins is located in the second hole of the plurality of holes of the substrate a portion of the locking anchor is located adjacent to a surface of the second flange facing away from the first surface of the substrate.

11. The current sensing device according to claim 1, further comprising a second substrate, wherein the second substrate comprises a plurality of holes projecting at least part way through the second substrate from a first surface of the second substrate, wherein prior to the coil element being mounted to the second substrate each of the plurality of holes has a circular cross section, and wherein, when the coil element is mounted to the first surface of the second substrate:

a second end portion of the first locating pin of the two locating pins is located in a first hole of the plurality of holes in the second substrate;

a second end portion of the second locating pin of the two locating pins is located in a second hole of the plurality of holes in the second substrate;

a third section of the first locating pin including the second end portion located in the first hole in the second substrate is bent with respect to the second section of the first locating pin such that an obtuse angle between the third section and second section of the first locating pin is in the direction of the second locating pin; and a third section of the second locating pin including the end portion located in the second hole in the second substrate is bent with respect to a second section of the second locating pin such that an obtuse angle between the third section and second section of the second locating pin is in the direction of the first locating pin.

12. The current sensing device according to claim 1, wherein prior to the locating pins being located into the holes in the substrate the coil element is configured such that the two locating pins can move within their respective at least one locating cavity in a direction perpendicular to the axis of the winding body.

13. The current sensing device according to claim 1, comprising a plurality of coil elements mounted to the substrate.

* * * * *